United States Patent
Frank et al.

(10) Patent No.: US 10,667,338 B2
(45) Date of Patent: May 26, 2020

(54) MICROWAVE GENERATOR FOR A MICROWAVE DEVICE AND MICROWAVE DEVICE

(71) Applicant: E.G.O. Elektro-Geraetebau GmbH, Oberderdingen (DE)

(72) Inventors: Marcus Frank, Oberderdingen (DE); Konrad Schoenemann, Sulzfeld (DE); Ewald Bayer, Dormettingen (DE)

(73) Assignee: E.G.O. Elektro-Geraetebau GmbH, Oberderdingen (DE)

( * ) Notice: Subject to any disclaimer, the term of this patent is extended or adjusted under 35 U.S.C. 154(b) by 365 days.

(21) Appl. No.: 15/612,524

(22) Filed: Jun. 2, 2017

(65) Prior Publication Data
US 2017/0359863 A1 Dec. 14, 2017

(30) Foreign Application Priority Data

Jun. 13, 2016 (DE) .......................... 10 2016 210 388

(51) Int. Cl.
*H05B 6/68* (2006.01)
*H05B 6/66* (2006.01)
(Continued)

(52) U.S. Cl.
CPC ............. *H05B 6/686* (2013.01); *H05B 6/642* (2013.01); *H05B 6/6417* (2013.01); *H05B 6/666* (2013.01);
(Continued)

(58) Field of Classification Search
CPC ...... H05B 6/6417; H05B 6/642; H05B 6/686; H05B 6/666; H05K 1/0204; Y02B 40/143

USPC ....... 219/709, 691–701, 702, 715, 745, 746, 219/750, 752, 753, 728, 747; 361/739, 361/816, 713, 718, 719; 307/9.1; 375/376
See application file for complete search history.

(56) References Cited

U.S. PATENT DOCUMENTS

2004/0050842 A1  3/2004  Han et al.
2004/0145929 A1  7/2004  Mihara et al.
(Continued)

FOREIGN PATENT DOCUMENTS

DE   102014226280 A1   6/2016
EP      1398998 A2      3/2004
(Continued)

OTHER PUBLICATIONS

European Patent Office, Extended European Search Report for Application No. 17170054.5, dated Nov. 15, 2017, 5 pages, Germany.

*Primary Examiner* — Quang T Van
(74) *Attorney, Agent, or Firm* — Alston & Bird LLP

(57) ABSTRACT

A microwave generator for a microwave device includes a single component carrier for control components and power components, which includes a continuous carrier material. Two power regions and one control region are provided on the component carrier. In the control region, electrically functional components are arranged on both flat sides of the component carrier, while in the power regions, electrically functional components with at least one power switch are arranged only on an upper flat side, heat sinks being arranged on the lower flat side. An RF substrate is provided in regions on the upper flat side of the power region.

21 Claims, 2 Drawing Sheets

(51) Int. Cl.
  *H05B 6/64* (2006.01)
  *H05K 1/02* (2006.01)
  *H05K 1/14* (2006.01)

(52) U.S. Cl.
  CPC ......... *H05K 1/0204* (2013.01); *H05K 1/0243* (2013.01); *H05K 2201/0187* (2013.01); *H05K 2201/10371* (2013.01); *H05K 2201/10416* (2013.01); *Y02B 40/143* (2013.01)

(56) References Cited

U.S. PATENT DOCUMENTS

2016/0183332 A1* 6/2016 Frank .................... H05B 6/642
                                                                    219/728
2016/0295683 A1* 10/2016 Uchida .............. H05K 7/20463

FOREIGN PATENT DOCUMENTS

| JP | S59-93099 U | 6/1984 |
| JP | 2011-060567 A | 3/2011 |
| JP | 2011-135670 A | 7/2011 |
| JP | 2011-150872 A | 8/2011 |

* cited by examiner

MICROWAVE GENERATOR FOR A MICROWAVE DEVICE AND MICROWAVE DEVICE

CROSS-REFERENCE TO RELATED APPLICATIONS

This application claims priority to German Application No. 10 2016 210 388.1, filed Jun. 13, 2016, the contents of which are hereby incorporated herein in its entirety by reference.

TECHNOLOGICAL FIELD

The invention relates to a microwave generator for a microwave device, and to a microwave device provided with such a microwave generator, in particular a microwave oven.

BACKGROUND

A microwave generator for a microwave device in the form of a microwave oven is known, for example, from US 2016/183332 A1. Above all, it is described therein that such a microwave generator comprises two channels, each having its own amplifier circuit and an antenna. It is thereby possible to operate with two different frequencies of the microwaves, for example in order to heat food to be cooked better or more rapidly in the microwave oven.

BRIEF SUMMARY

The object of the invention is to provide a microwave generator of the type mentioned in the introduction, and a microwave device provided therewith, with which problems of the prior art can be resolved and, in particular, it is possible to ensure the structure of the microwave generator in a practical way, and at the same time simply, with a secure function, in which case the microwave generator may in particular have two power ranges corresponding to two amplifier circuits.

This object is achieved by a microwave generator and by a microwave oven. Advantageous and preferred configurations of the invention are the subject-matter of the claims and will be described in more detail below. In this context, many of the features are described only for the microwave generator or only for the microwave device. Regardless thereof, however, it is intended that they may apply separately and independently of one another or together both for the microwave generator and for the microwave device. The wording of the features is included in the content of the description by explicit reference.

Provision is made that the microwave generator has a single flat and extensive component carrier for electrical or electronic control-function components as control components, and for electrical or electronic functional components as power components. This advantageously applies for electrically functional components which are involved directly in the generation of microwaves. This means that other components of the microwave device, for example a fan in a microwave oven as a microwave device, are independent components and may have their own component carrier with electrically functional components thereon. These, however, are then provided for driving the fans and do not therefore count as electrically functional components for the generation of microwaves. The component carrier comprises a continuous carrier material, and is advantageously configured in one part, or one piece. This carrier material may correspond to that of a conventional circuit board, and therefore comprises fibers or glass fibers which are embedded in a matrix material, for example in resin.

At least one power region and at least one control region are provided on the component carrier. These form the essential parts or components for the generation of microwaves, advantageously the only electrical or electronic components for the generation of microwaves. In the control region, electrically functional components may be arranged on both flat sides of the component carrier, i.e. on the top and bottom. The component density can thus be increased and the control region can be kept small.

In the power region, electrically functional components, which comprise at least one power switch, are arranged only on one flat side of the component carrier, in particular on an upper flat side. Heat sinks, cooling means or the like, but no electrically functional components, are arranged on the other flat side in the power region. By this division in the power region, a high power density can be achieved, in particular with heat generation by the power switches, which are advantageously power semiconductors that are conventional per se. The provision of heat sinks, cooling means or the like essentially on a separate flat side, so to speak reserved therefor, of the component carrier allows good cooling or removal of a large amount of generated heat.

With the invention overall, a compact structure of the microwave generator can therefore be achieved, which does not require a particularly large amount of space with a high functionality, and in particular with a concept that also allows extension for a plurality of channels for the generation of microwaves.

According to one configuration of the invention, the component carrier is the only component carrier for the aforementioned electrically functional components, which are provided for the direct generation of microwaves, of the entire microwave generator or the entire microwave device. Thus, again, above all the structure of the microwave generator, or of an entire microwave device, can be simplified.

In one advantageous configuration of the invention an RF substrate, i.e. so-called RF-active material, is arranged on the component carrier. This is advantageously provided on an upper flat side in the power region, specifically where the aforementioned power switches are also arranged or mounted. Particularly advantageously, provision may be made for the power switches to be fitted directly to the RF substrate or mounted thereon. This RF substrate advantageously has good dielectric properties. Its good dielectric RF properties are therefore available where they are needed, namely in the power region, and in particular at or under the power switches. Nevertheless, no unnecessary costs are entailed for regions in which this expensive RF material, which is sometimes difficult to process, is not absolutely required.

In one simple configuration of the invention, the RF substrate may be placed or adhesively bonded as an additional layer or additional flat component onto the corresponding flat side of the component carrier. In another advantageous configuration, a recess or indentation, into which the RF substrate is fitted, is provided on, for example milled into, this flat side of the component carrier. In this way an excessive increase in the thickness of the component carrier as a result of the RF substrate can be reduced or avoided. Particularly advantageously, the RF substrate may be arranged flush with the surface in the component carrier, or in a recess in the component carrier, so that the total thickness of the component carrier is not increased. The RF substrate may have a thickness of between 5% and 70% of the thickness of the component carrier, preferably between 25% and 50%.

Besides power switches, isolators and couplers may also be provided on the component carrier in the power region. A take-off of the coupler may then in turn be fed to a measurement circuit, which is arranged in the control region but close to the coupler itself. The radio frequency generated may then be coupled into a coaxial cable or directly into a waveguide or an antenna, for introduction into the microwave device, or a compartment, cavity or the like.

In one possible configuration of the invention, in the region directly below a power switch, a recess extending fully through the component carrier is provided, in which a good to very good heat conductor, for example a metal part, advantageously consisting of copper or a similar highly thermally conductive material, or alternatively a heat pipe, is fitted. The power switch is then seated on the upper side of this heat conductor, if possible thermally coupled even better by thermally conductive paste or the like. An aforementioned heat sink or other cooling means may then be thermally conductively connected to the lower side of the heat conductor, in order to dissipate to the air the heat generated by the power switch and transferred to the heat conductor.

In another configuration of the invention, a first power region may be arranged on one side of the control region and next thereto. A second power region may be arranged on another side, or the opposite side, of the control region and next thereto, so that the two power regions have the control region between them. A microwave generator having two channels may thus advantageous be constructed, particularly advantageously according to US 2016/183332 A1.

In one advantageous configuration of the invention, only a single control region may be provided on the microwave generator, or in the microwave device. Some contacts may be routed thereto from the outside as an input, for example for communication, for at least one door contact and for a power connection. Particularly when a switched-mode power supply is also provided in the control region, a power connection is advantageously provided. A controller, or a microcontroller, for the microwave generator is preferably likewise provided in the control region.

In yet another configuration of the invention, provision may be made for only SMD components, i.e. no electrically functional components which project with pins or the like into recesses in the component carrier, to be arranged in the control region on one flat side of the component carrier. On the other flat side of the component carrier, only so-called THT components are advantageously provided, i.e. ones which are fitted into or through recesses in the component carrier with contact pins. By this separation of the component types and division between the two flat sides of the component carrier, a higher component density can be achieved, and furthermore component application and soldering can thus be carried out better.

Provision may be made for the SMD components to be arranged on an upper flat side of the component carrier, specifically preferably on the one on which the aforementioned power switches of the power region are also provided. The THT components are then advantageously provided on the other flat side of the component carrier. The advantage of arranging the SMD components on the upper side, or the upper flat side, is that their small installation height can then be exploited better. Above all when the aforementioned THT components are arranged on a lower flat side of the component carrier, where the aforementioned heat sink or another cooling means which has a greater installation height away from the lower flat side of the component carrier are also arranged, overall the higher components or parts can thus be provided on a common side of the component carrier. If a switched-mode power supply for the microwave generator is also provided in the control region, then larger components, such as capacitors, are required therefor, which can then also be fitted much better to a heat sink or other cooling means in terms of requirement for installation height.

Also for the arrangement of the switched-mode power supply per se, the adjacent arrangement, advantageously provided with a short distance, of the power regions next thereto, in particular on both sides of a control region with the switched-mode power supply, is advantageous. In this way, the electrical connections can depart from the switched-mode power supply directly to the left and to the right in order to supply the power switches of the power regions. In this case, the connections may be fed by means of through-contacts known per se from a lower flat side of the component carrier to the upper flat side on the component carrier, and there subsequently to the power switches likewise provided on the upper flat side.

A mains isolation relay may be provided in the switched-mode power supply, in order to reduce the standby consumption of the microwave generator and of a microwave device provided therewith.

In another configuration of the invention, a so-called circulator is provided on the component carrier in order to protect the amplifier circuit, or the components of the microwave generator, from fed-back microwaves. Depending on the structure selected, however, it is also possible to omit the circulator. In this case, at the input of the drive of the power components, by feedback from the coupler their drive may be modified in such a way that the power output is reduced in the event of a fed-back microwave power that is too great. The circulators mentioned above have proven suitable for this. To this end, however, it is very important that short distances are provided in the drive, or between the couplers and the power switches even of different channels. Precisely this can be achieved particularly well and simply with the present invention because of the arrangement of the relevant components close to one another. Lengthy RF cables or the like could be integrated only with difficulty, or not at all, into a microwave device, and their function would then no longer be good enough. Thus, particularly in the event of a returning microwave power which is too great on one channel, the power output for both channels may be limited by a directly acting and therefore very rapidly reacting hardware solution.

In another configuration of the invention, at least one signal of at least one coupler acts back or is fed back onto at least one oscillator and/or at least one gain of the power switches and/or at least one voltage supply of the power switches. Thus, the microwave incidence into the compartment may be reduced or switched off in the event of an excessively high reflected wave.

One oscillator may be provided per channel of the microwave generator, i.e. in particular two oscillators in the case of two channels. These oscillators may be synchronized in order, in the case of coherent frequency, to produce a variation of the phase angle for better generation of the microwaves.

Close to an outer side of component carrier, in particular a rear outer side, and also in the vicinity of the power switches heat sinks or cooling means, one or more fans may be provided in a microwave device. These ensure sufficient cooling.

In one configuration of the invention, provision may be made that the microwave generator, or a microwave device provided therewith, in total comprises a power measurement and a communication connection. These, or connections for these functional units, are particularly advantageously arranged on the single component carrier, and in particular electrically connected thereto. Control functions are also present on the component carrier, in order to monitor so-called door contacts of the microwave device. In this case, a kind of rapid or emergency switch-off is provided, so that the generation of microwaves is stopped immediately when the door of the microwave device is opened. If such a door contact is connected directly to the component carrier, or to a controller provided thereon, then further simplification of the structure of a microwave device is possible.

In one advantageous configuration of the invention, all the interfaces of the microwave generator, or of its component carrier, are provided in one direction, preferably in the direction towards a front side of the microwave device. Contacting is then simpler because it only needs to be carried out from one direction, and the microwave generator itself can then be placed flexibly in the microwave device. In particular, a connection to at least one door contact is fed to the microwave generator from the front. Arrangement of the aforementioned fans on the rear side of the component carrier is then also advantageous, in order to blow the cooling air forwards in the microwave device from behind, so that it can emerge at the front side which is usually accessible. The oscillators are advantageously also arranged in a rear region of the component carrier, i.e. close to the fans which are present and away from the external contacts to the component carrier.

These and other features are revealed by the claims as well as the description and the drawings, and the individual features may be implemented individually or several together in the form of subcombinations in an embodiment of the invention and in other fields, and may represent advantageous and individually protectable embodiments for which protection is claimed here. The division of the application into individual sections and subheadings does not restrict the comments made therein in their general applicability.

BRIEF DESCRIPTION OF THE SEVERAL VIEWS OF THE DRAWINGS

Exemplary embodiments of the invention are schematically represented in the drawings and will be explained in more detail below. In the drawings.

DETAILED DESCRIPTION

Figure 1:
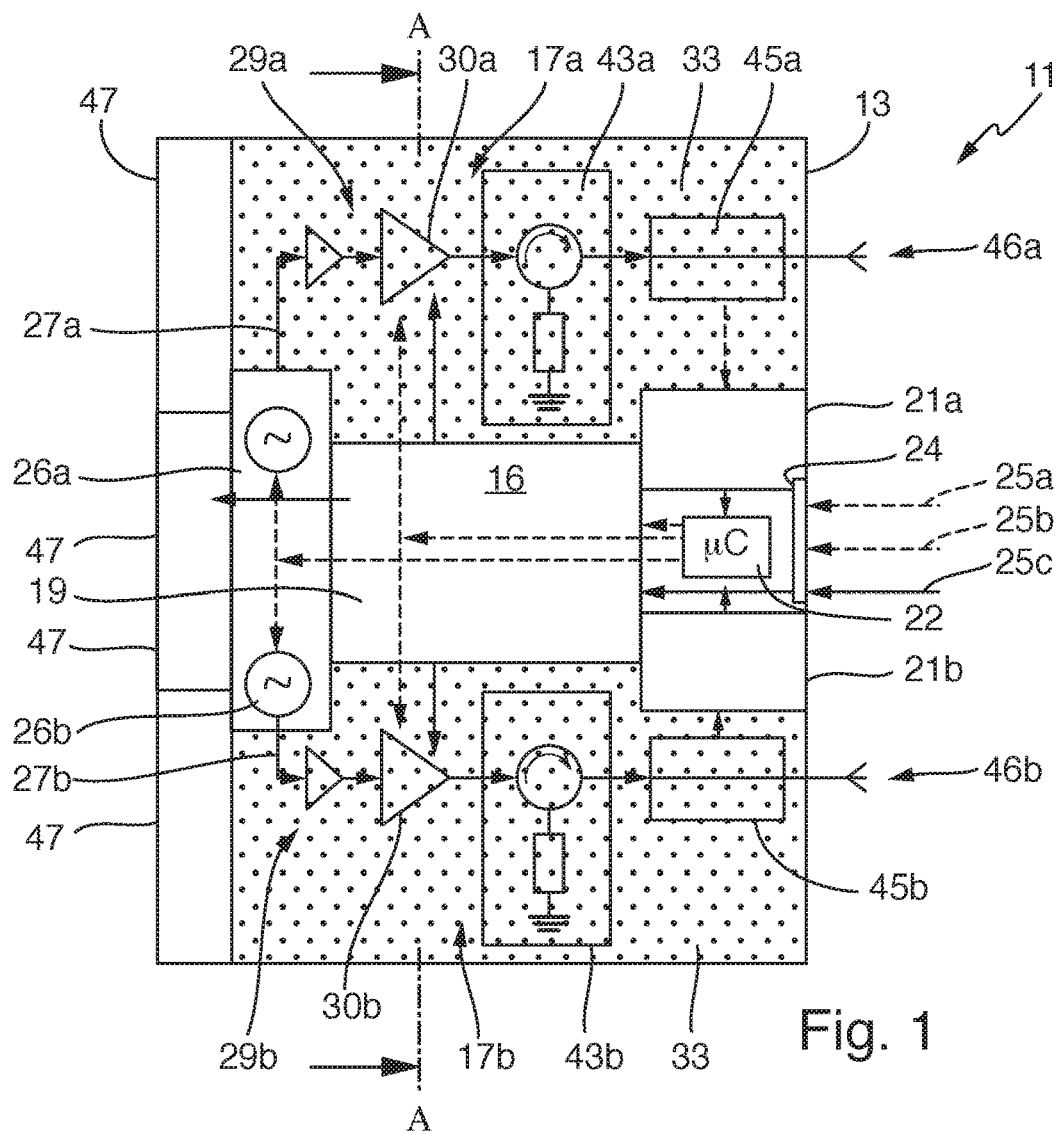
FIG. 1 shows a schematic plan view of a microwave generator according to the invention for a microwave device according to the invention.

FIG. 1 schematically represents a plan view of a microwave generator 11 according to the invention. This microwave generator 11 is, as described above, configured for so to speak two channels, as is known from US 2016/183332 A1. The microwave generator 11 comprises a single continuous component carrier 13, advantageously consisting of a per se conventional circuit board material, such as FR4. This is then processed further according to the invention, as will be explained below.

Figure 2:
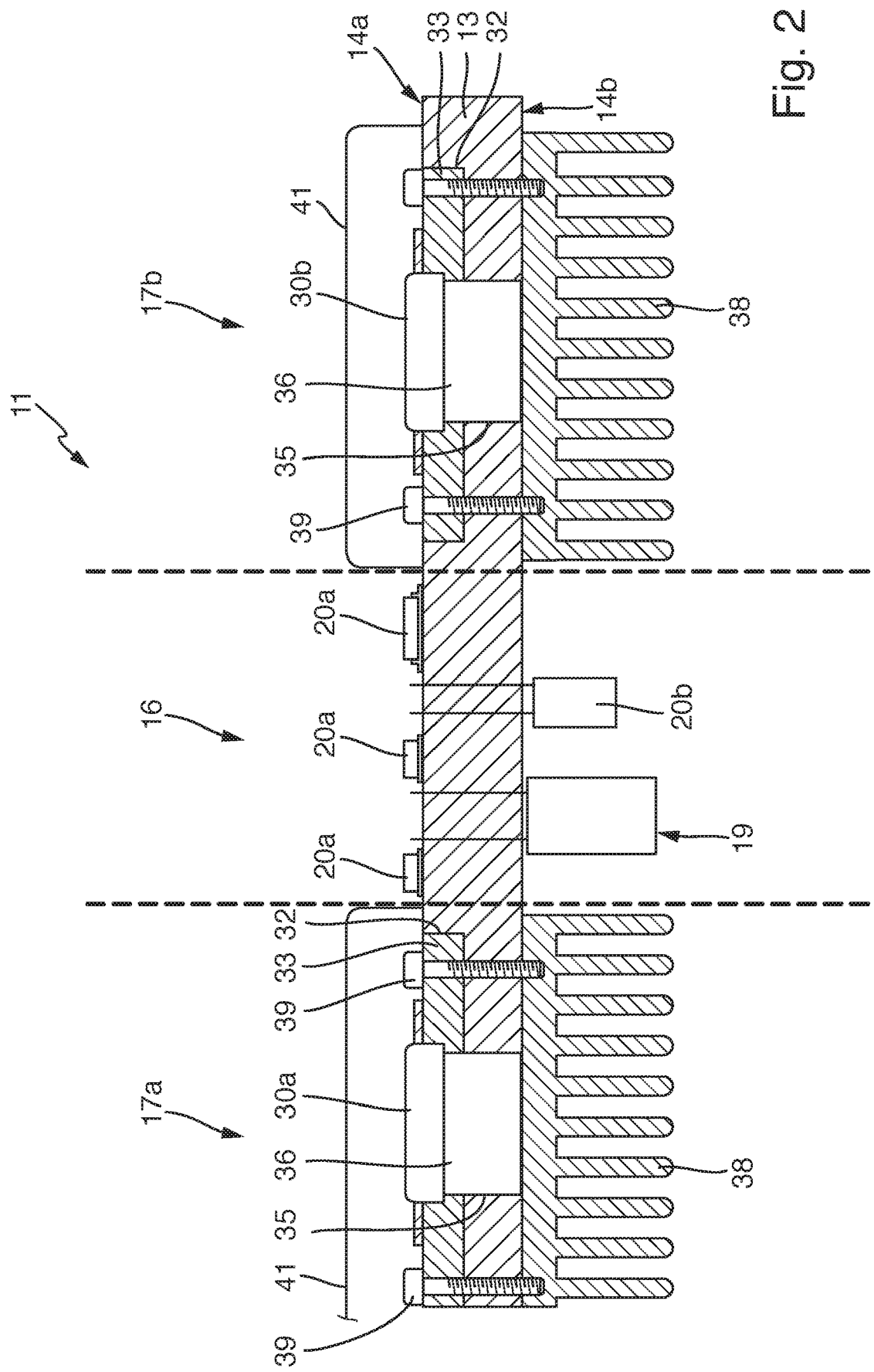
FIG. 2 shows a section through the microwave generator, or its component carrier, of FIG. 1.

The component carrier 31 has an upper flat side 14a and a lower flat side 14b, as can be seen above all in the sectional representation of FIG. 2 along the dot-and-dash line A-A. The component carrier 13 is subdivided into a central control region 16 and, on the left and right thereof, two power regions 17a and 17b. Here, the power region 17a is provided above the control region 16 and the power region 17b is provided underneath.

A switched-mode power supply 19 is provided in the control region 16, advantageously on the lower side, or on the lower flat side 14b, of the component carrier 13, as can be seen from FIG. 2. In the control region, measurement circuits 21a and 21b are provided on the right of the switched-mode power supply 16, one for each channel. Arranged between them, there is a microcontroller 22 for the entire microwave generator 11, and optionally even for the entire microwave device comprising this microwave generator. Connections 24 for inputs are provided, an upper input 25a being used for the communication, in particular coming from control elements or the like on the microwave device. A central input 25b is provided for the door contacts mentioned in the introduction, and a lower input 25c is a power connection. The latter is connected through as directly as possible to the switched-mode power supply 19 by means of the connections 24.

On the left thereof, and as directly as possible to the switched-mode power supply 19, oscillators 26a and 26b are provided, again one for each channel. Although these bridge, so to speak, or the central or middle control region 16, they do in fact at least partially belong to the radiofrequency components and therefore to the power regions 17a and 17b. The oscillators 26a and 26b are each connected to an amplifier 29a and 29b. These amplifiers 29a and 29b respectively comprise a power switch 30a and 30b, which can be additionally driven with signals by the microcontroller 22 and supplied with power by the switched-mode power supply 19.

The amplifiers 29a and 29b, or their power switches 30a and 30b, are connected to isolators 43a and 43b, as are known from the prior art, although each of these may be omitted if there are corresponding switch-off devices. The isolators are connected to couplers 45a and 45b, to the respective RF outputs of which antennas 46a and 46b are connected. This is again known from the prior art. Instead of the antennas 46, which are advantageously configured as waveguides, a coaxial cable could also be connected. This, however, would be required overall only in the event of sizeable distances, but would at the same time be elaborate and functionally disadvantageous because of the longer paths and larger number of connections.

To the left on the component carrier 13, or on a rearward edge, three fans 47 are provided, advantageously fastened on the component carrier 13 or connected thereto to form a module, for example by conventional fastening brackets or the like. These cool the microwave generator 11, in particular its amplifiers 29 or power switches 30 and the switched-mode power supply 19. A readily preassemblable and readily installable module is thus obtained.

As can be seen from the regions of the upper flat side 14a of the component carrier 13 which are defined by dots in FIG. 1, the RF substrate mentioned in the introduction may be provided here. For more detailed explanation, reference is made to FIG. 2, which is described below.

FIG. 2 shows the central control region 16, which has the power region 17a next to it on the left and the power region 17b on the right. In the control region 16, the control components 20a in the form of SMD components are provided on an upper flat side 14a of the component carrier 13. Advantageously, only SMD components are provided here, so that an installation height can be kept relatively small. On a lower flat side 14b of the component carrier 13, further control components 20b are provided, which are configured as so-called THT components with schematically represented connection pins, which extend through through-holes (not represented or explained in detail) in the component carrier 13 and are soldered onto one of the flat sides 14a or 14b. To represent the switched-mode power supply 19, a relatively large THT component is represented here. All the THT components of the control region 16 are arranged on the lower flat side 14b, so that their naturally relatively large installation height is only provided there.

The aforementioned further constituents of the control region 16, such as measurement circuits 21a and 21b as well as the microcontroller 22, including the connections 24, may also be arranged on the upper flat side 14a of the component carrier 13. This is not represented in detail here. It depends essentially on their design, i.e. whether they are SMD components or THT components. Optionally, the connections 24 may be provided on the lower flat side 14b and connected by means of known through-contacts to the upper flat side 14a. This arrangement would have the advantage that direct through-contacting of the power input 25c to the switched-mode power supply 19 on the lower flat side 14b is then possible. In the installed state, the connections 24 advantageously point toward a front, or front side, of the microwave device so that they, or the entire microwave generator 11, as explained in the introduction, can be contacted more easily.

In the power regions 17a and 17b, the two channels of the microwave generator 11 are constructed substantially symmetrically. Here, as a particular feature, the arrangement of RF material or RF substrate 33 in recesses 32 in the upper flat side of the component carrier 13 can be seen. It could, however, likewise be applied onto the upper flat side without a recess, i.e. surface-wide. The thickness of the RF substrate 33, or the depth of the recesses 32, may in this case constitute about 40% of the total thickness of the component carrier 13, although it may also be more or less. The introduction of the RF substrate 33 into the recesses 32 may be carried out in a manner known per se, for example by placement, lamination, casting or adhesive bonding of corresponding flat material into previously produced recesses in the component carrier 13. The provision of the RF substrate 33 having very good dielectric properties in this region is used to reduce the emissions where the radiofrequency components are fitted, particularly in the power region.

The high-quality RF substrate 33 is not required in the region of the microcontroller 22 and of the switched-mode power supply 19, or in the entire control region 16. The RF substrate 33 may, for example, be obtained from the company Rogers. By its incorporation, a kind of hybrid component carrier or hybrid circuit board is provided.

The power switches 30a and 30b are placed on the RF substrate 33, or lie thereover. Since the heat conduction properties of the RF substrate 33 are not particularly good, a hole 35 through the component carrier 13 in which heat conductors 36a and 36b, so-called thermocoins, are provided, is respectively arranged below the power switches 30.

These advantageously consist of copper and conduct the heat from the power switches 30 downward to respective heat sinks 38. These heat sinks 38 are firmly screwed below on the component carrier 13 in a known manner by means of screws 39. RF screening 41 is respectively provided above the power switches. This ensures less emission of spurious signals. Such RF screening 41 may be configured as a kind of cover made of sheet metal, die-casting or similar material. A sheet-metal cover in this case appears particularly advantageous since it can have mounting lugs that can be fitted through holes in the component carrier 13 and subsequently clamp or be interlocked for fastening.

The representations reveal the compact size advantageously achieved according to the invention, as well as the short connection paths. For example, the distance between the switched-mode power supply 19 and the oscillators 26 and the amplifiers 17, together with the power switches 30, is very short. Even high currents can thus be conducted well, a single switched-mode power supply being sufficient for this.

The measurement circuits 21 are used to measure the power via the couplers 45. A control loop can therefore be set up via the microcontroller 22 back to the oscillators 26 and the amplifiers 17, in order to keep the power constant and, for example, compensate for temperature drift. In addition, rapid switching off of the amplifiers on the hardware side may be implemented when exceeding the return power to the coupler. By means of this, the circulators can be omitted and the power switches 30 are nevertheless protected.

In a general configuration of the invention, provision may be made for the switched-mode power supply to be configured in such a way that its output voltage is variable. Power adaptation of the microwave generator 11 can thus be carried out, for example in the event of a poor power input into food to be cooked in the case of a microwave oven according to the invention as the microwave device. Furthermore, rapid reaction or influencing from one channel onto the other is possible by virtue of the compact design of the microwave generator 11. Furthermore, integration of the switched-mode power supply 19 into the microwave generator 11, or on its single component carrier 13, reduces the installation size and saves on material costs and assembly costs, for example by virtue of local capacitors for temporary storage of charge. In addition, perturbing effects can be avoided.

Tuning of the RF circuit in a power region may be carried out directly on the component carrier 13. To this end, integrated tuning means may be provided, as actually known per se to the person skilled in the art.

Figure 3:
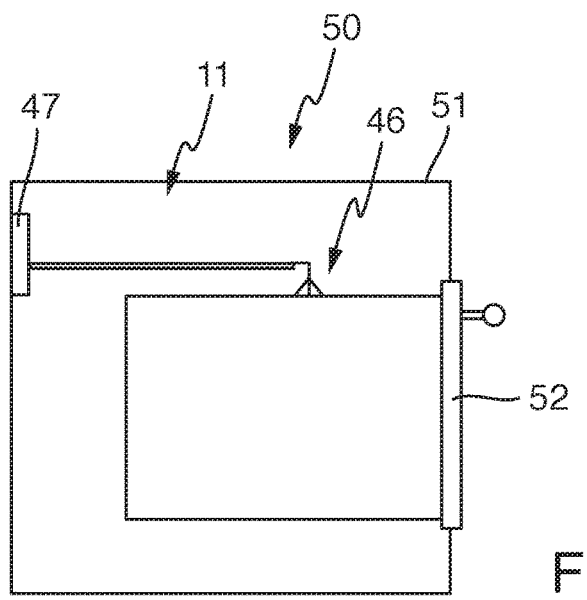
FIG. 3 shows a highly schematized side view of a microwave device according to the invention in the form of a microwave oven.

FIG. 3 represents a microwave device according to the invention as a microwave oven 50. The microwave oven 50 comprises a housing 51 having a door 52, which leads into a compartment 54 as the cavity. Above this, the microwave generator 11 according to the invention is arranged in the housing 51. The fans 47 feed air onto a rear side of the housing 51, or are supplied there with fresh air. The microwave generator 11 extends at least partially over the compartment 54. The above-described antennas 46 are directed downwards, or onto the compartment 54.

Door contacts known per se (not represented in detail here) are provided on the door 52, for example where the door 52 engages in a kind of lock or latch on the housing 51. These door contacts are fed at the input 25b to the connections 24, in accordance with FIG. 1.

That which is claimed:

1. A microwave generator for a microwave device, comprising:
a single component carrier for control components and power components of said microwave generator, said component carrier comprising two flat sides;
said component carrier further comprising:
a continuous carrier material; and
at least one power region and at least one control region are provided on said component carrier,
wherein:
in said control region, electrically functional components are arranged on both said flat sides of said component carrier;
in said power region, electrically functional components with at least one power switch are arranged only on a first of said flat sides;
in said power region, heat sinks, cooling means are arranged on a second of said flat sides;
an RF substrate is arranged on said component carrier; and
the RF substrate is fitted sunk in a recess into an upper of said two flat sides of said component carrier.

2. The microwave generator according to claim 1, wherein:
said component carrier is the only component carrier for electrically functional components for microwave generation of said entire microwave device.

3. The microwave generator according to claim 1, wherein:
on said upper flat side said power switch are also mounted.

4. The microwave generator according to claim 3, wherein:
said power switch are mounted on said RF substrate.

5. The microwave generator according to claim 1, wherein:
a first said power region is arranged on one side of said control region, and beside said first power region a second power region is arranged on another side of said control region.

6. The microwave generator according to claim 1, wherein:
in said control region, only surface mount device (SMD) components are arranged on one said flat side of said component carrier, and only through hole technology (THT) components are arranged on said other flat side of said component carrier.

7. The microwave generator according to claim 6, wherein:
said SMD components are arranged on an upper one of said flat sides of said component carrier, wherein also power switch of said power region are arranged on said upper side of said component carrier.

8. The microwave generator according to claim 1, wherein:
a circulator is provided on said component carrier in order to detect fed-back microwaves, said circulator being configured in order, at an input of a drive of said power components, to modify a driving of said power components by feedback in such a way that said power components are not damaged by said fed-back microwaves.

9. The microwave generator according to claim 1, wherein:
at least one signal of at least one coupler acts back on at least one oscillator, at least one gain of said power switch, or at least one voltage supply of said power switch, in order to reduce or switch off a microwave incidence into said compartment in an event of an excessively high reflected microwave.

10. A microwave device comprising the microwave generator according to claim 1.

11. The microwave device according to claim 10, said microwave device being a microwave oven.

12. The microwave device according to claim 10, wherein:
all interfaces of said microwave generator, or of said component carrier of said microwave generator, are provided in one direction.

13. The microwave device according to claim 12, wherein:
all said interfaces are provided in a direction towards a front side of said microwave device.

14. The microwave device according to claim 13, wherein:
a connection to a door contact is fed to said microwave generator from said front side of said microwave device.

15. The microwave device according to claim 14, wherein:
at least one fan is arranged on a rear side of said component carrier.

16. A microwave generator for a microwave device, comprising:
a single component carrier for control components and power components of said microwave generator, said component carrier comprising two flat sides;
said component carrier further comprising:
a continuous carrier material; and
at least one power region and at least one control region are provided on said component carrier,
wherein:
in said control region, electrically functional components are arranged on both said flat sides of said component carrier;
in said power region, electrically functional components with at least one power switch are arranged only on a first of said flat sides;
in said power region, heat sinks, cooling means are arranged on a second of said flat sides; and
in a region directly below one of said power switch, a recess extending fully through said component carrier is provided, wherein a good heat conductor is fitted into said recess, said power switch being arranged on an upper side of said heat conductor, wherein a heat sink or other cooling means are thermally conductively connected to a lower side of the heat conductor.

17. The microwave generator according to claim 16, wherein said good heat conductor comprises copper.

18. The microwave generator according to claim 16, wherein:
in said control region, only surface mount device (SMD) components are arranged on one said flat side of said component carrier, and only through hole technology (THT) components are arranged on said other flat side of said component carrier; and
said SMD components are arranged on an upper one of said flat sides of said component carrier, wherein also power switch of said power region are arranged on said upper side of said component carrier.

19. A microwave generator for a microwave device, comprising:
- a single component carrier for control components and power components of said microwave generator, said component carrier comprising two flat sides;

said component carrier further comprising:
- a continuous carrier material; and
- at least one power region and at least one control region are provided on said component carrier, wherein:
- in said control region, electrically functional components are arranged on both said flat sides of said component carrier;
- in said power region, electrically functional components with at least one power switch are arranged only on a first of said flat sides;
- in said power region, heat sinks, cooling means are arranged on a second of said flat sides; and
- a power measurement, a communication connection and at least one connection for at least one door contact are arranged on said single component carrier.

20. The microwave generator according to claim 19, wherein:
- a circulator is provided on said component carrier in order to detect fed-back microwaves, said circulator being configured in order, at an input of a drive of said power components, to modify a driving of said power components by feedback in such a way that said power components are not damaged by said fed-back microwaves.

21. The microwave generator according to claim 19, wherein:
- at least one signal of at least one coupler acts back on at least one oscillator, at least one gain of said power switch, or at least one voltage supply of said power switch, in order to reduce or switch off a microwave incidence into said compartment in an event of an excessively high reflected microwave.

* * * * *